United States Patent [19]
Iijima

[11] Patent Number: 5,285,374
[45] Date of Patent: Feb. 8, 1994

[54] APPARATUS FOR GENERATING DIGITAL SIGNAL SYNCHRONIZED WITH PHASE OF POWER SUPPLY

[75] Inventor: Atsushi Iijima, Tokorozawa, Japan

[73] Assignee: Kabushiki Kaisha Toshiba, Kawasaki, Japan

[21] Appl. No.: 760,361

[22] Filed: Sep. 16, 1991

[30] Foreign Application Priority Data

Sep. 17, 1990 [JP] Japan .................. 2-246444

[51] Int. Cl.$^5$ ............... G05B 15/02; G01R 19/00
[52] U.S. Cl. ..................... 364/140; 323/241; 328/155; 364/483
[58] Field of Search ............ 364/148, 160–163, 364/483, 807, 602, 718; 328/155, 133, 134, 107, 110; 331/17, 1 A, 14, 25; 307/511, 529; 375/118–120, 111; 324/83 R, 83 D, 83 FE; 323/237, 241, 244; 363/87, 129

[56] References Cited
U.S. PATENT DOCUMENTS

| | | | |
|---|---|---|---|
| 3,657,732 | 4/1972 | Krause | 328/155 |
| 4,484,152 | 11/1984 | Lee | 331/1 A |
| 4,564,819 | 1/1986 | Hirose | 331/2 |
| 4,903,283 | 2/1990 | Eisenberg | 377/43 |
| 4,916,403 | 4/1990 | Sudoh et al. | 328/155 |

FOREIGN PATENT DOCUMENTS

0143405  7/1985  European Pat. Off. .
2941287  4/1981  Fed. Rep. of Germany .
WO89/05065  6/1989  PCT Int'l Appl. .

*Primary Examiner*—Joseph Ruggiero
*Attorney, Agent, or Firm*—Foley & Lardner

[57] ABSTRACT

The microcomputer reads phase difference angle data latched at the leading edge and the trailing edge of a binary logic signal composed depending on the polarity of each phase voltage of an a.c. power supply and compares the phase difference angle data with a predetermined value. Then, proportional plus integral operation is performed about the compared deviation so as to reduce the deviation to zero. The resulting value is sent to an integrating circuit in which the integrating operation is cleared and re-started each time the integrated value reaches a predetermined value. The leading inclination of the integration signal obtained by the integrating circuit changes depending on the value of the input signal. By latching the value of the integration signal at the leading edge and the trailing edge of the logic signal, the phase difference angle data can be modified. As such, if the a.c. power frequency is changed out of a constant state, the microcomputer automatically operates to direct the read phase difference angle to a command value as close as possible and to pick up a signal synchronized with the phase of an a.c. power supply and matched to a predetermined value from the latch circuit.

7 Claims, 3 Drawing Sheets

APPARATUS FOR GENERATING DIGITAL SIGNAL SYNCHRONIZED WITH PHASE OF POWER SUPPLY

BACKGROUND OF THE INVENTION

1. Field of the Invention

The present invention relates to an apparatus for feeding a digital signal synchronized with a phase of an a.c. power supply.

2. Description of the Prior Art

In order to control a thyristor leonard system and a cyclo-converter which are capable of performing control of the phase for voltage adjustment or a power source system for recovering power, the system having a pulse width modulation system converter provided with a self-quenchable switching element, a control system for those systems, in general, requires a signal synchronized with a phase of the d.c. power supply so that the control system works in synchronization with the phase of an a.c. power supply.

With recent remarkable developments in microcomputers, microcomputers have been widely used in phase control units of thyristors as well as other control units.

To detect a phase-synchronized signal for a microcomputer, therefore, various kinds of phase locked loop circuits have been made practically available.

FIG. 1 shows an arrangement of a representative phase locked loop circuit.

As shown, a voltage detector 1 steps down a supply voltage and outputs phase voltage signals U, V, W to a logic detector circuit 2. The logic detector circuit 2 serves to transform the voltage signals U, V, W into a logic level "1" or "0" depending on the polarity of each signal and to feed logic signals 2a to 2c to a ROM 3 in which those logic signals 2a to 2c are applied, to lower rank addresses A0 to A2 of the ROM 2. The upper rank addresses A3 to A6 of the ROM 3 receive frequency-divided signals 7a to 7d sent from a frequency divider circuit 7. The ROM 3 stores pieces of binary voltage information 3a to 3c at the addresses corresponding to those address signals. Each binary voltage information 3a to 3c is read from a data output terminal D0 to D2 of the ROM 3 and is provided to an adder 4. The ROM 3 has the other data output terminal D3 from which a frequency-division clearing signal 3d is read, and is provided to the frequency dividing circuit 7. This clearing signal 3d serves to limit the division of an electric angle 180° into 12 partial frequencies. The adder 4 serves to add the corresponding voltage signal to each binary voltage information 3a to 3c and provided the added signal 4a to a voltage smoothing circuit 5. The voltage smoothing circuit 5 serves to smooth the added signal 4a and feed a smoothed voltage signal 5a to a voltage oscillation circuit 6. The voltage oscillation circuit 6 transforms the smoothed voltage signal 5a into the corresponding pulse frequency signal 6a, for example, a frequency corresponding to 12-fold power frequency $f_s$. The frequency divider circuit 7 divides the pulse signal 6a into divided frequency signals 7a to 7d of 1/16, ½, ¼ and ½.

In the case where no voltage abnormality or no phase slippage appears in the a.c. power source, the ROM 3 specifies each binary data stored at each phase interval 15° (180°/120 to the corresponding address so that the ROM 3 may output a voltage signal 3a of "1" at a first 90° interval (0° to 90°), a signal 3a of "0" at a second 90° interval (90° to 180°), a signal 3a of "1" at a third 90° interval (180° to 270°), and a signal 3a of "0" at a fourth 90° interval (270° to 360°) and voltage signals 3b, 3c for the other two phases (V and W phases) at the data output terminals D0, D1, D2. The voltage signals 3b and 3c are respectively shifted by 120° and 240° with respect to the voltage signal 3a of the reference phase.

In case the voltage detecting signals U, V, W are in normal states, the ROM 3 serves to output the voltage signals 3a, 3b, 3c for keeping the output voltage 5a of the voltage smoothing circuit 5 constant. The voltage signals 3a, 3b, 3c are shifted by 120° with respect to each signal and have iterative values of "1" and "0" at each 90° interval for each phase.

This results in keeping an output pulse signal 6a of the voltage oscillating circuit 6 at a constant frequency pulse and this state means that the voltage detecting signals U, V, W are synchronized with the phase voltage of an a.c. bus. In case an abnormal state takes place in the voltage signals U, V and W at each of 12-divided phase intervals, the phase of each voltage information 3a to 3b is shifted and this results in changing the output voltage 5a of the smoothing circuit 5, thereby entering the output signal 6a of the voltage oscillating circuit 6 into an intermittent oscillating state. That is, the output signal 6a is not made to be a constant frequency pulse.

Actually, if the foregoing PLL feeds a signal synchronized with a phase of the a.c. power source under the control of the microcomputer when controlling the power source, the microcomputer works on the output signal 6a of the voltage oscillating circuit 6 used as a fundamental clock of the microcomputer.

The accuracy of the foregoing power source phase synchronizing apparatus depends on the accuracy of the voltage smoothing circuit 5 and the voltage oscillating circuit 6. In case the supply frequency is shifted by a rate of 10%, the voltage oscillating circuit 6 enters into an intermittent oscillating state, resulting in phase-slipping phenomenon. This phenomenon is brought about especially when the power source led to the a.c. bus is changed from a commercial power source to a non-utility generator.

As will be understood from the above description, if the phase-slipping phenomenon appears in the phase locked loop, an abnormal state takes place in the control of the system using the synchronized signal as a fundamental clock of the microcomputer, resulting in fatal damage to the overall system.

In addition, the peripheral components around the voltage smoothing circuit 5 and the voltage oscillating circuit 6 are composed of analog circuits and this is one of the factors for lowering reliability of the overall system.

SUMMARY OF THE INVENTION

The present invention is made to overcome the foregoing disadvantages, and it is an object of the present invention to provide a reliable apparatus for feeding a signal synchronized with a phase of a power supply which is capable of enduring a phase-slipping phenomenon with respect to the slippage of a frequency of a power supply.

According to an aspect of the present invention, the apparatus for outputting a signal synchronized with a phase of a power supply includes a voltage detector for detecting a voltage of each phase of an a.c. bus; a logic detector circuit for transforming the detected voltage signals into logic signals synchronized with the detected voltage signals; a decoder circuit for detecting a leading edge and a trailing edge of each of the logic signals; operating means for comparing a predetermined phase difference angle command value with the resulting phase-synchronized signal for obtaining a deviation between them and feeding a phase difference angle modifying value allowing the deviation to be reduced to zero; an integrating circuit for integrating the phase difference angle modifying value and clearing the value and re-starting the integral operation each time the integrated value reaches a predetermined value; and a latch circuit for latching an integrated value obtained by the integrating circuit at the leading edge and the trailing edge of each of the logic signal and feeding the latched value as a phase-synchronized signal.

In operation, this apparatus takes the steps of transforming each phase voltage of an a.c. bus into a binary logic signal, reads phase difference angle data at the leading edge and the trailing edge of the logic signal by using the microcomputer, compares the phase difference angular data with a pre-set phase angle command value, performs proportional plus integral operation of the compared deviation, and supplies the phase difference angle modifying data to a repetitive type of integrating circuit for constantly reducing the resulting deviation to zero. The output of the integrating circuit is latched at the leading edge and the trailing edge of the logic signal and the resulting signal is used as phase difference angle data.

In case, therefore, the supply frequency on the a.c. bus is changed out of a constant state, the microcomputer operates to allow the read phase difference angle to come closer to the phase difference angle command value. Hence, the phase signal obtained by latching an output signal of the integrating circuit by using a latch circuit is synchronized with a phase of a voltage on the a.c. bus and the phase difference angle command value.

DESCRIPTION OF THE PREFERRED EMBODIMENT

Figure 2:
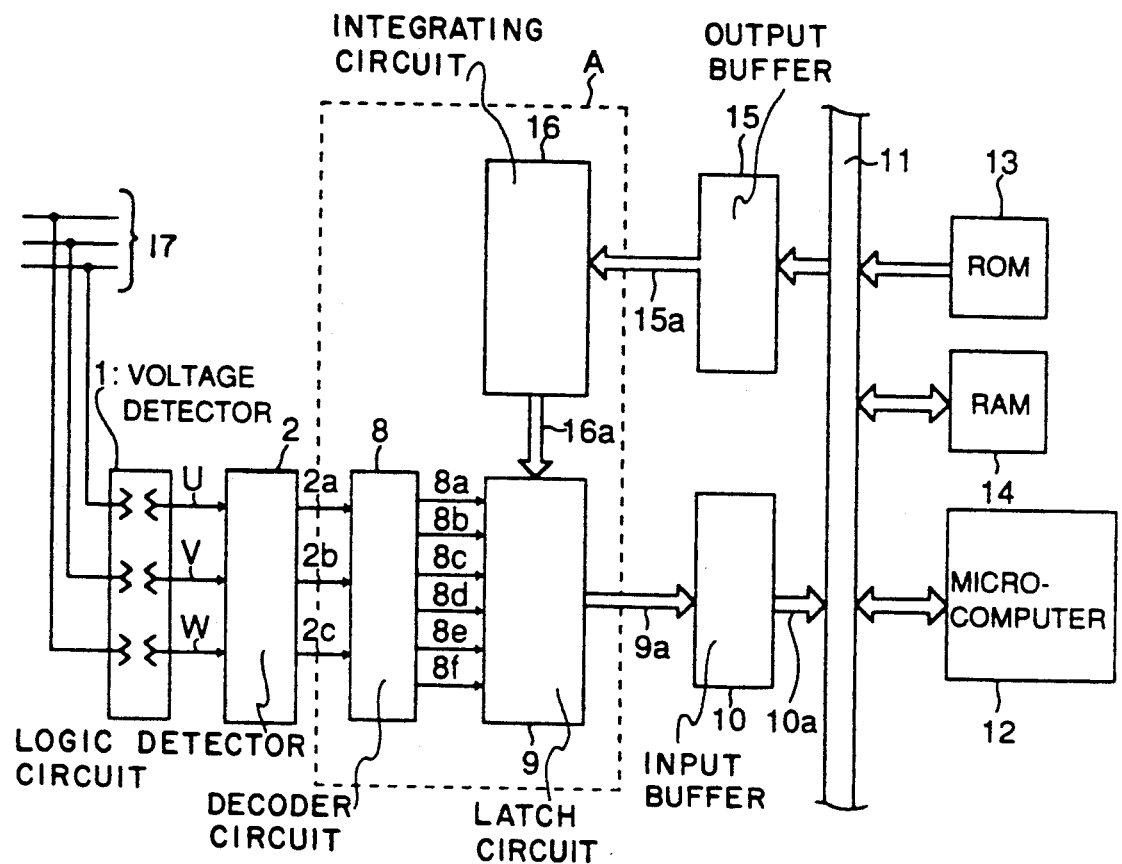
FIG. 2 is a block diagram showing an apparatus for feeding a signal synchronized with a phase of a power supply according to an embodiment of the present invention.

FIG. 2 is a block diagram showing an apparatus for outputting a signal synchronized with a phase of a power supply according to an embodiment of the invention. As shown, a voltage detector 1 steps down the voltage on an a.c. bus 17 and outputs the phase voltage signals U, V, W to a logic detector 2 The logic detector 2 transforms the voltage signals U, V and W into the corresponding logic level "1" or "0" depending on the polarity of those signals The resulting logic signals 2a to 2c are sent to a decoder circuit 8. The decoder circuit 8 serves to decode the logic signals 2a to 2c and output the decoded signals 8a to 8f synchronized with the voltage signals U, V and W. Those decoded signals 8a to 8f are sent from the decoder circuit 8 to a latch circuit 9. The latch circuit 9 receives the decoded signals 8a to 8f and latches a phase difference angle data 16a output from an integrating circuit 16 at the leading edge and the trailing edge of each of the logic signals 2a to 2c. Then, the latch signal 9 feeds the latched signal as a phase-synchronized signal 9a. The latch circuit 9 is connected to an input buffer 10 in which the phase-synchronized signal 9a is temporarily stored as data 10a. The data 10a is read by the microcomputer 12 through a bus line 11. This microcomputer 12 includes a ROM 13 for storing an operation program and a RAM 14 for storing an operational result processed by the program. The microcomputer 12 sends the operational result as the phase difference angle modifying data 15a to the integrating circuit 16 through an output buffer 15. This integrating circuit 16 adds (that is, integrates) the phase difference angle modifying data 15 at constant intervals and re-starts the integral operation each time the integrated value reaches a predetermined value VC. The integrating circuit 16 then sends out the phase difference angle data 16a obtained as an integrated value signal to the latch circuit 9.

Figure 1:
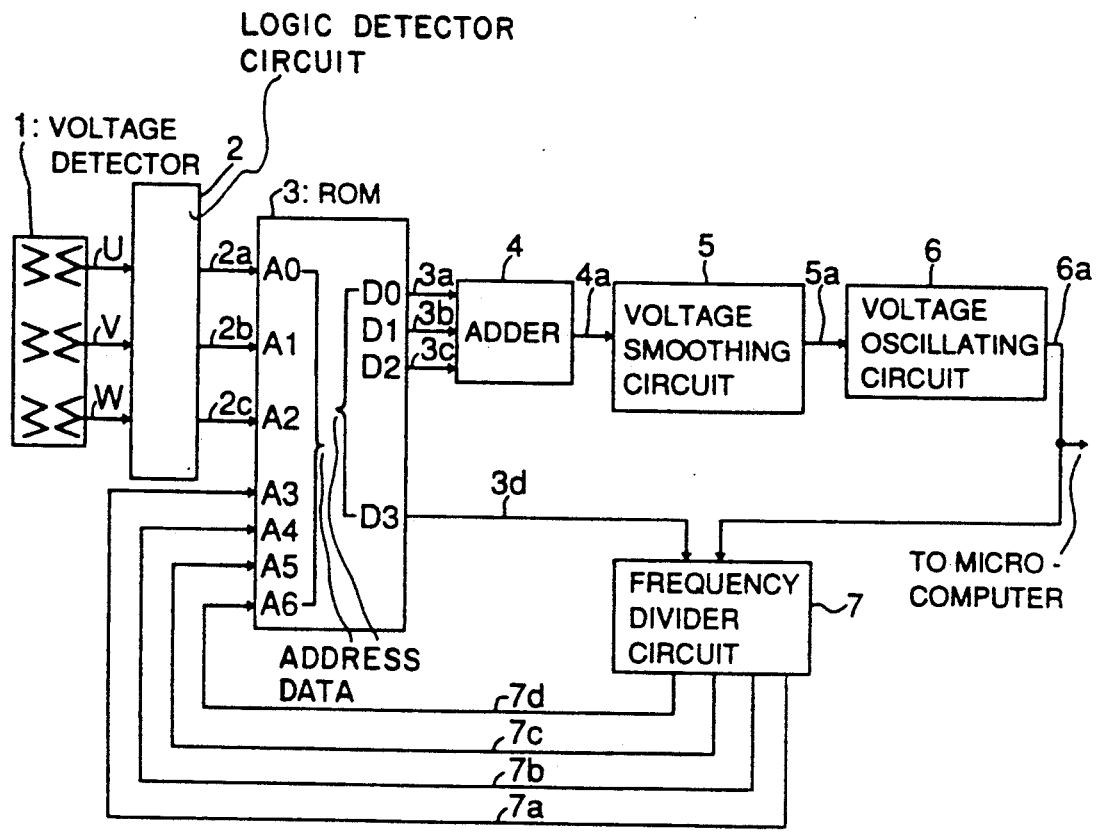
FIG. 1 is a block diagram showing an apparatus for feeding a signal synchronized with a phase of a power supply.

The present embodiment provides a decoder circuit 8, a latch circuit and an integrating circuit 16 enclosed by a dotted line A in place of the ROM 3, the adder 4, the voltage smoothing circuit 5, a voltage oscillating circuit 6, and a frequency dividing circuit 7 provided in the prior art as shown in FIG. 1.

The operation of the present embodiment having the foregoing arrangement will be described with reference to FIGS. 2 and 3.

Figure 3:
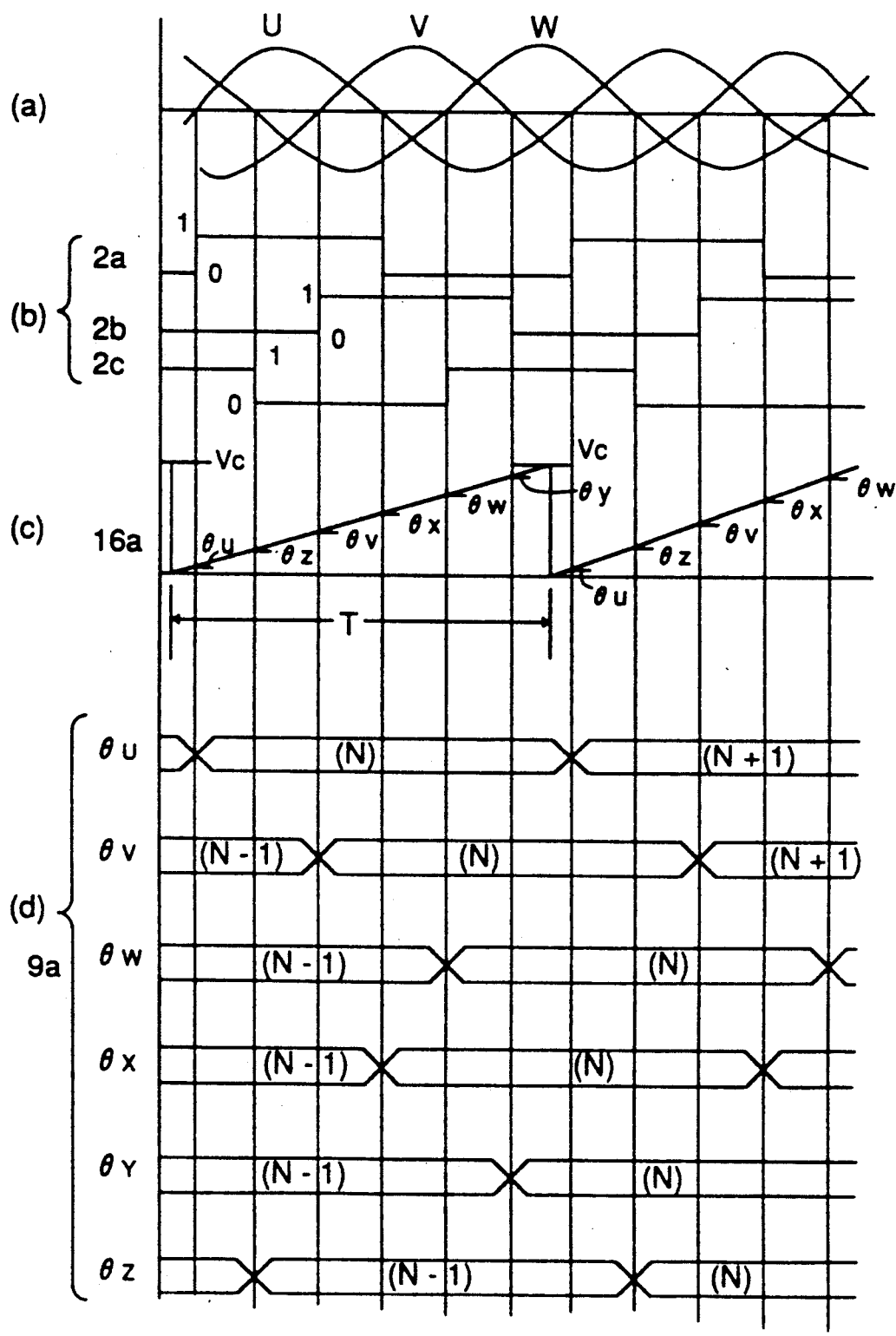
FIG. 3 is a time chart for describing operation of the apparatus shown in FIG. 2.

A voltage detector 1 detects each phase voltage on the a.c. bus 17 and feed the voltage signals U, V, W as shown in a part (a) of FIG. 3. The logic detector circuit 2 transforms those voltage signals U, V, W into the logic level "1" or "0" depending on the polarity of each signal and feeds the logic signals as shown in a part (b) of FIG. 3 to a decoder circuit 8. The decoder circuit 8 generates pulse signals 8a, 8b, 8c at the leading edges of the logic signals 2a, 2b, 2c and pulse signals 8d, 8e, 8f at the trailing edges of the logic signals 2a, 2b, 2c, respectively. The latch circuit 9 latches phase difference angle data 16a (see a part (c) of FIG. 3) sent from the integrating circuit 16 in synchronization with the signals 8a to 8f sent from the decoder circuit 8 (therefore, the leading edges and the trailing edges of the signals 2a to 2c) and then feeds phase-synchronized signals $\theta_u$, $\theta_v$, $\theta_w$, $\theta_x$, $\theta_y$, $\theta_z$ as shown in a part (d) of FIG. 3. In FIG. 2, a signal 9a indicates a collection of those signals. Those phase-synchronized signals $\theta_u$ to $\theta_z$ are respectively allocated to respective addresses of the microcomputer 12. Hence, the microcomputer 12 can individually read the phase-synchronized signals $\theta_u$ to $\theta_z$ through an input buffer 10.

Assuming that the microcomputer 12 reads the signal $\theta_u$ latched at the leading edge of the signal 2a, the microcomputer 12 compares a value of the signal $\theta_u$ with a phase difference angle command value pre-set in the ROM 13 and performs a proportional plus integral operation of the resulting deviation. Then, the microcomputer 12 obtains such a phase difference angle modifying data as constantly reducing the deviation to zero and feeds the obtained data to the integrating circuit 16 through the output buffer 15 so that the obtained data is added as the phase difference angle modifying data 15a to the integrating circuit 16.

In the case where the data $\theta_u$ latched at the leading edge of the signal 2a is smaller than the phase difference angle command value, the deviation is positive. The steps are taken of magnifying the phase difference angle modifying data 15a to be input to the integrating circuit 16, reducing a period T of the signal 16a, and thereby sharpening an inclination of the leading edge of the signal 16a. This results in the phase difference angle data $\theta_u$ latched at the leading edge of the signal 2a by the latch circuit 9 is made larger. On the other hand, in case the data $\theta_u$ latched at the leading edge of the signal 2a is larger than the phase difference angle command value, the deviation is negative. Hence, the operation reverse to the above is carried out, resulting in the phase difference angle data $\theta_u$ being made smaller.

The microcomputer 12 works to process the other phase-synchronized signals $\theta_u$, $\theta_v$, $\theta_w$, $\theta_x$, $\theta_y$, $\theta_z$ in the similar manner.

According to the present embodiment, the phase-synchronized signals $\theta_u$, $\theta_v$, $\theta_w$, $\theta_x$, $\theta_y$, $\theta_z$ are individually corrected. It will be easily understood from the skilled persons in this art that the present invention is not merely limited to this embodiment but may apply to the arrangement which takes the steps of adding those signals and processing the averaged value.

What is claimed is:

1. An apparatus for generating a digital signal synchronized with a phase of a power supply comprising:
    a voltage detector for detecting a voltage of each phase of an a.c. bus;
    a logic detector circuit for transforming resulting phase-synchronized signals into logic signals synchronized with said phase-synchronized signals;
    a decoder circuit for detecting a leading edge and a trailing edge of each of said logic signals;
    operating means for obtaining a deviation of a phase-synchronized signal from a predetermined phase difference angle command value and for outputting a phase difference angle modifying value signal, said phase difference angle modifying value signal causing said deviation to be reduced to zero;
    an integrating circuit for integrating said phase difference angle modifying value signal and clearing said value and re-starting the integrating operation each time an integrated value reaches a predetermined value; and
    a latch circuit for latching said integrated value obtained by said integrating circuit at the leading edge and the trailing edge of each of said logic signals and outputting the latched integrated value as said phase-synchronized signal.

2. An apparatus according to claim 1, wherein said operating means compares said phase difference angle command value with said phase-synchronized signal and performs a proportional plus integral operation of the compared deviation for the purpose of outputting said phase difference angle modifying value.

3. An apparatus according to claim 1, wherein said operating means is composed of a microcomputer.

4. An apparatus according to claim 1, wherein said phase-synchronized signal is composed of two or more signals corresponding to two or more phase points and those signals are individually processed in said operating means and said integrating circuit.

5. An apparatus according to claim 1, wherein said phase-synchronized signal is composed of two or more signals corresponding to two or more phase points and the added values of said two or more signals are processed in said operating means and said integrating circuit.

6. An apparatus according to claim 1, wherein said phase-synchronized signal is composed of two or more signals corresponding to two or more phase points and the average value of said two or more signals are processed in said operating means and said integrating circuit.

7. A method for generating a digital signal synchronized with a phase of a power supply, comprising the steps of:
    detecting a voltage of each phase of an a.c. bus and outputting a phase-synchronized detected voltage;
    transforming said phase-synchronized detected voltage into logic signals;
    detecting a leading edge and a trailing edge of each of said logic signals;
    obtaining a deviation of a phase-synchronized signal from a predetermined phase difference angle command value and outputting a phase difference angle modifying value signal, said modifying value signal causing said deviation to be reduced to zero;
    integrating said phase difference angle modifying value in an integrating circuit and clearing said value and restarting the integrating operation each time an integrated value reaches a predetermined value and outputting said integrated value; and
    latching said integrated value obtained by said integrating circuit at said leading edge and said trailing edge of each of said logic signals and outputting the latched value as said phase-synchronized signal.

* * * * *